(12) United States Patent
Chen et al.

(10) Patent No.: US 10,674,629 B1
(45) Date of Patent: Jun. 2, 2020

(54) WATER-COOLING HEAD

(71) Applicant: AURAS Technology Co., Ltd., New Taipei (TW)

(72) Inventors: Chien-An Chen, New Taipei (TW); Chien-Yu Chen, New Taipei (TW); Wei-Hao Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/394,010

(22) Filed: Apr. 25, 2019

(30) Foreign Application Priority Data

Apr. 3, 2019  (TW) ............................ 108111970 A

(51) Int. Cl.
| | |
|---|---|
| *H05K 7/20* | (2006.01) |
| *F25D 11/00* | (2006.01) |
| *F25D 21/04* | (2006.01) |
| *F25D 21/14* | (2006.01) |
| *F25D 23/02* | (2006.01) |
| *F25D 27/00* | (2006.01) |
| *G06F 1/20* | (2006.01) |

(52) U.S. Cl.
CPC ........... *H05K 7/20272* (2013.01); *G06F 1/20* (2013.01); *H05K 7/20263* (2013.01); *G06F 2200/201* (2013.01)

(58) Field of Classification Search
CPC . H05K 7/20; F25D 11/00; F25D 21/04; F25D 21/14; F25D 23/02; F25D 27/00
USPC .......... 361/702; 62/272, 277, 246, 248, 449, 62/455, 440, 255
See application file for complete search history.

(56) References Cited

U.S. PATENT DOCUMENTS

| | | | | |
|---|---|---|---|---|
| 5,046,328 | A * | 9/1991 | Yoshida ................ | A47F 3/0408 62/248 |
| 2010/0197879 | A1* | 8/2010 | De Broqueville ....... | B01J 2/006 526/348 |
| 2011/0126569 | A1* | 6/2011 | Selin ..................... | F25D 23/085 62/272 |
| 2011/0126570 | A1* | 6/2011 | Andersson ............ | F25D 17/067 62/272 |
| 2011/0146336 | A1* | 6/2011 | Selin ..................... | F25D 23/063 62/449 |
| 2011/0162403 | A1* | 7/2011 | Selin ..................... | F25D 23/063 62/264 |
| 2011/0179816 | A1* | 7/2011 | Andersson ............. | F25D 21/04 62/277 |

* cited by examiner

*Primary Examiner* — Xiaoliang Chen
(74) *Attorney, Agent, or Firm* — WPAT, PC

(57) ABSTRACT

A water-cooling head includes a casing, an inclined flow-guiding structure and a bottom plate assembly. The casing includes an inlet and an outlet. A liquid is fed into the inlet. The inclined flow-guiding structure is disposed within the casing, and includes plural first openings. A bottom end of the inclined flow-guiding structure is located under the inlet. A top end of the inclined flow-guiding structure is arranged beside the outlet. The top end is located at a level higher than the bottom end. A second opening is formed in the bottom end. The bottom plate assembly is assembled with the casing, and located under the inclined flow-guiding structure. The bottom plate assembly includes a fin group. After the liquid is transferred to the fin group through the second opening or the plural first openings, the liquid is exited from the outlet.

12 Claims, 11 Drawing Sheets

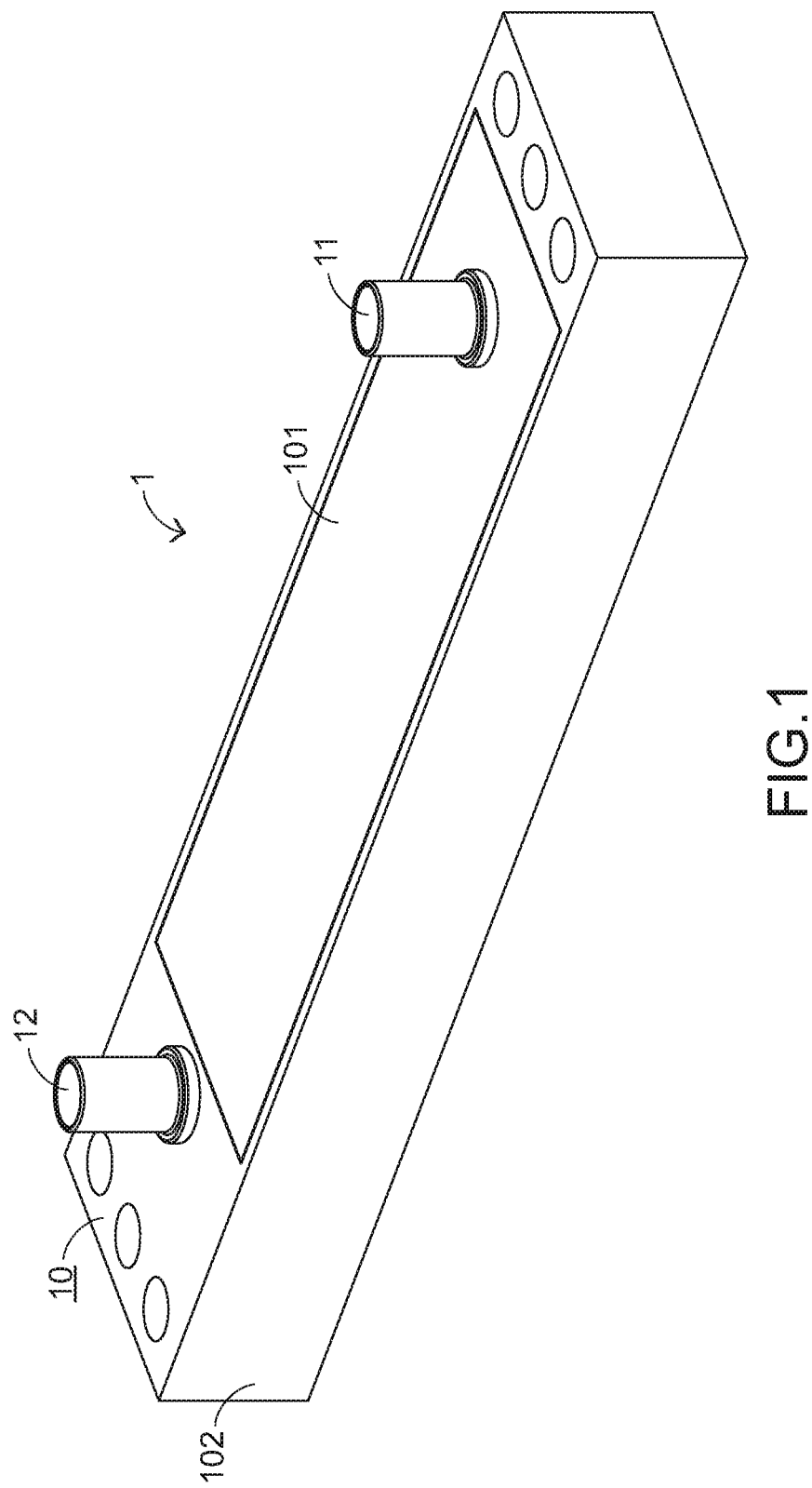

WATER-COOLING HEAD

FIELD OF THE INVENTION

The present invention relates to a head dissipation device, and more particularly to a water-cooling head.

BACKGROUND OF THE INVENTION

With increasing development of science and technology, various electronic devices (or computers) such as notebook computers, desktop computers or network servers have become indispensable devices in daily lives of people. Generally, during the operation of the electronic device, the temperature of the electronic components within the electronic device gradually increases. The elevated temperature may result in damage of the electronic components. For solving these problems, the electronic device is usually equipped with a heat dissipating mechanism. In accordance with a conventional heat dissipating mechanism, a fan is used to produce airflow to cool the electronic component through convection, or a heat dissipating unit made of a special material is attached on the electronic component to reduce the temperature through thermal conduction. In addition, a water cooling mechanism is one of the effective and common heat dissipating mechanisms.

The operating principles of the water cooling mechanism will be described as follows. Generally, the water cooling mechanism uses a cooling liquid (e.g., water or coolant) as the cooling medium, and uses a continuously-running pump to move the liquid within an applied system along a circulating loop. The liquid flows along sealed pipes. The pipes are distributed to the surfaces of the electronic components (e.g., the central processing unit) in the system. When the liquid with the lower temperature flows through the electronic component with the higher temperature, the liquid absorbs the heat from the electronic component to decrease the temperature of the electronic component. Then, through heat exchange, the heat is released from the pipes to the surroundings or another heat dissipating mechanism. Consequently, the temperature of the liquid is decreased. Then, the liquid is returned back to the system and transferred along the circulating loop to remove the heat.

A water-cooling head is one of the main heat dissipation components of the water-cooling piping system. The existing water-cooling head is usually made of copper or aluminum. The inner space of the water-cooling head has a chamber, a channel and associated structure. Consequently, the cooling liquid with the lower temperature can be introduced into the water-cooling head. Moreover, the water-cooling head is in direct contact with the electronic component. After the cooling liquid in the chamber or the channel absorbs the heat from the electronic component, the cooling liquid flows out of the water-cooling head. Consequently, the heat generated by the operating electronic component can be dissipated away.

For effectively utilizing the heat dissipating efficacy of each circulating loop, the system is designed to have a longer water-cooling head to be simultaneously in contact with plural heat sources (i.e., the electronic components) to remove the heat. The area of the bottom surface of the water-cooling head may be determined according to the overall size of the arrangement of the electronic components. Moreover, the electronic components are in contact with the bottom surface of the water-cooling head.

Generally, when the cooling liquid is just fed into the water-cooling head, the temperature of the cooling liquid is lower. That is, the front segment of the water-cooling head (i.e., the position near the inlet of the water-cooling head) has the higher heat dissipating efficacy. However, the heat absorbed by the same cooling liquid in the same chamber may be accumulated. In the rear segment of the water-cooling head (i.e., the position near the outlet of the water-cooling head), the amount of the accumulated heat that is continuously absorbed by the cooling liquid is higher. Consequently, the local temperature is excessively high. In other words, the heat dissipating efficacy at the front segment of the water-cooling head for removing the heat of the electronic components is higher, and the heat dissipating efficacy at the rear segment of the water-cooling head for removing the heat of the electronic components is lower.

Therefore, there is a need of providing an improved water-cooling head in order to overcome the drawbacks of the conventional technologies.

SUMMARY OF THE INVENTION

For overcoming the drawbacks of the conventional technologies, the present invention provides a water-cooling head with an inclined flow-guiding structure. The water-cooling head is capable of simultaneously contacting with plural electronic components (i.e., heat sources) and removing the heat from the plural electronic components. Consequently, the efficacy of homogenizing the temperature is enhanced.

In accordance with an aspect of the present invention, a water-cooling head is provided. The water-cooling head includes a casing, an inclined flow-guiding structure and a bottom plate assembly. The casing includes an inlet and an outlet. A liquid is fed into the inlet. The inclined flow-guiding structure is disposed within the casing, and includes plural first openings. A bottom end of the inclined flow-guiding structure is located under the inlet. A top end of the inclined flow-guiding structure is arranged beside the outlet. The top end is located at a level higher than the bottom end. A second opening is formed in the bottom end. The bottom plate assembly is assembled with the casing, and located under the inclined flow-guiding structure. The bottom plate assembly includes a fin group. After the liquid is transferred to the fin group through the second opening or the plural first openings, the liquid is exited from the outlet.

In an embodiment, the liquid is moved along a circulating loop by a pump, and the pump is in fluid communication with the inlet.

In an embodiment, he water-cooling head is applied to one or plural electronic components, and the water-cooling head is in contact with the one or plural electronic components through the bottom plate assembly.

In an embodiment, the casing includes an upper cover and a lower cover. The upper cover is assembled with the lower cover. The inlet is disposed on the upper cover. The outlet is disposed on the lower cover.

In an embodiment, the inlet and the outlet are located at the same level, and an orientation of the inlet and an orientation of the outlet are in parallel with each other.

In an embodiment, the bottom plate assembly further includes a base plate, and the fin group is formed on the base plate. The fin group is integrally formed with the base plate, or the fin group and the base plate are different components and combined together.

In an embodiment, the water-cooling head further includes an upper chamber and a lower chamber. The upper chamber is arranged between the casing and the inclined flow-guiding structure. After the liquid is introduced into the upper chamber through the inlet, the liquid is exited from the upper chamber through the second opening or the plural first openings. The lower chamber is arranged between the base plate and the inclined flow-guiding structure. After the liquid is transferred to the lower chamber through the second opening or the plural first openings, the liquid is exited from the lower chamber through the outlet. The fin group is accommodated within the lower chamber.

In an embodiment, a side of the fin group has a stepped structure, and the inclined flow-guiding structure includes a protrusion part corresponding to the side of the fin group. The protrusion part is arranged beside the second opening and located over the side of the fin group.

In an embodiment, the fin group includes plural fins, and plural concave structures corresponding to the plural first openings are formed in the plural fins.

In an embodiment, the plural first openings are uniformly or non-uniformly distributed in a surface region of the inclined flow-guiding structure.

In an embodiment, the plural first openings are divided into several groups, and the distances between the first openings in the same group and the bottom end of the inclined flow-guiding structure are equal.

In an embodiment, the plural first openings have a circular shape, a rectangular shape, an elliptic shape or a rounded rectangular shape.

From the above descriptions, the water-cooling head of the prevent invention is capable of simultaneously contacting with plural electronic components (i.e., heat sources) and removing the heat from the plural electronic components. When the cooling liquid is transferred to the inclined flow-guiding structure, the cooling liquid is split by the inclined flow-guiding structure. In such way, the cooling liquid with the lower temperature can be uniformly guided to all segments to exchange the heat. Since the temperature of the cooling liquid in the water-cooling head is not locally high or locally low, the efficacy of homogenizing the temperature is enhanced.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 1 is a schematic perspective view illustrating a water-cooling head according to a first embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
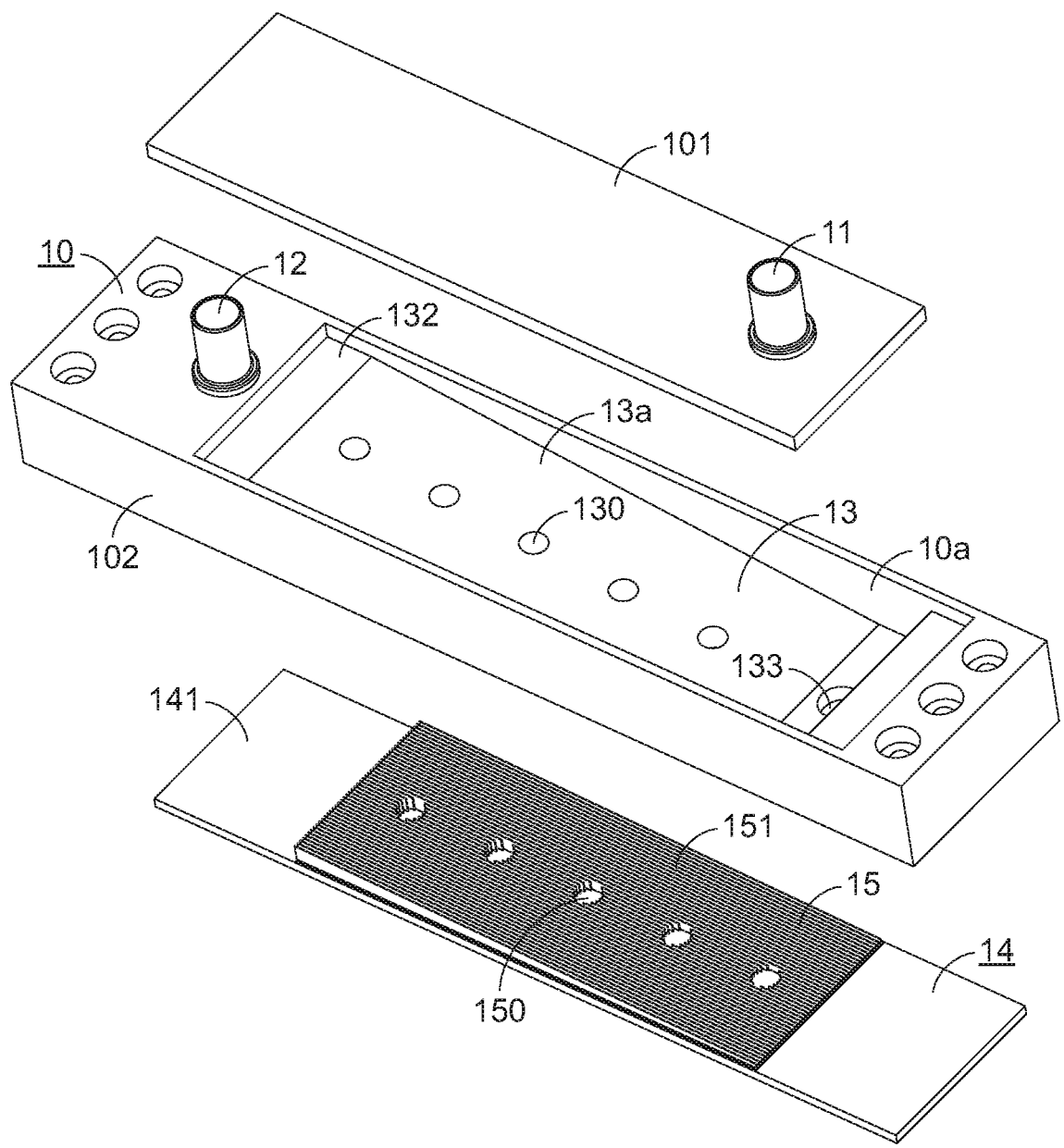
FIG. 2A is a schematic exploded view illustrating the water-cooling head according to the first embodiment of the present invention.
Figure 2B:
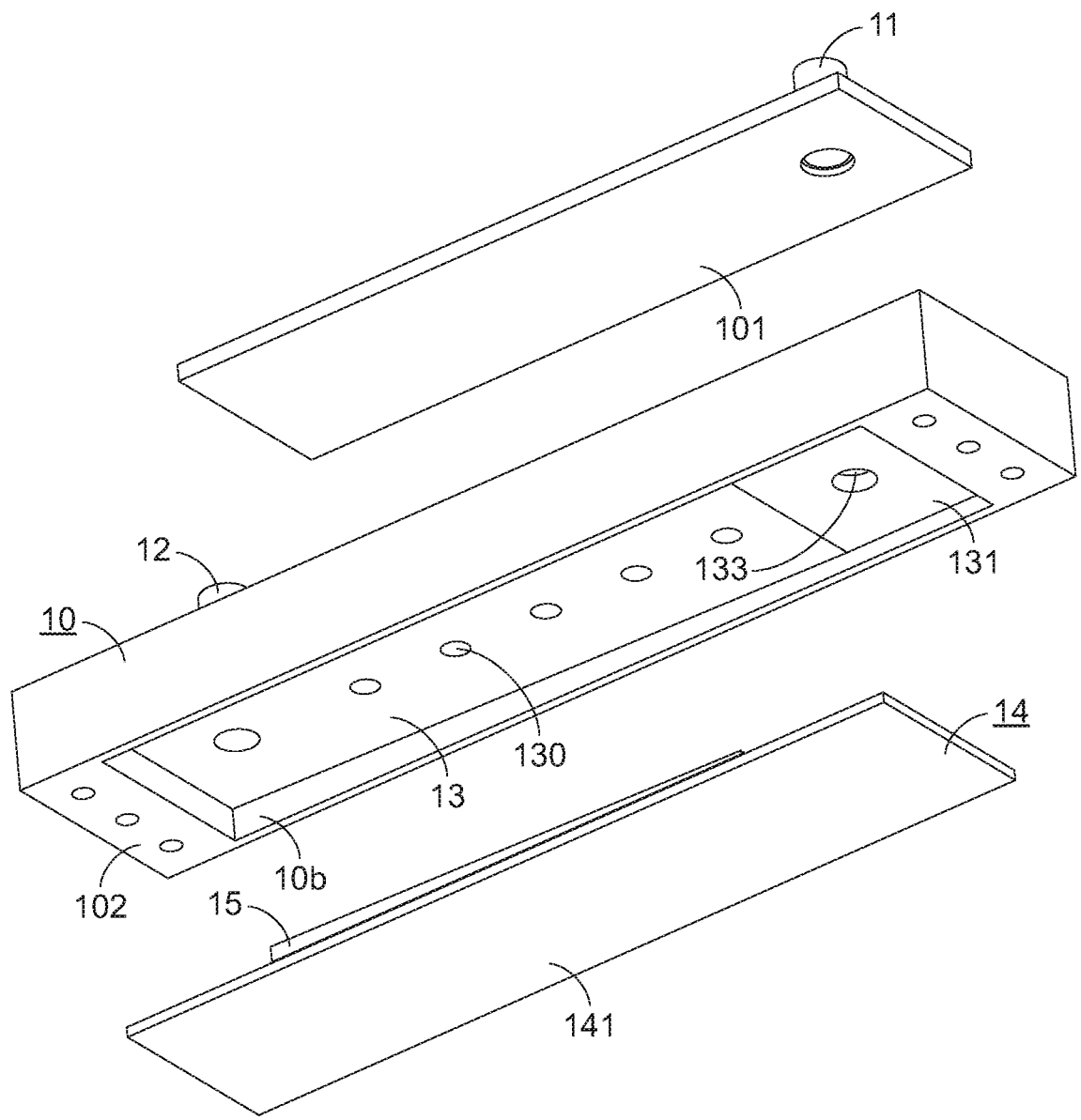
FIG. 2B is a schematic exploded view illustrating the water-cooling head as shown in FIG. 2A and taken along another viewpoint.
Figure 3A:
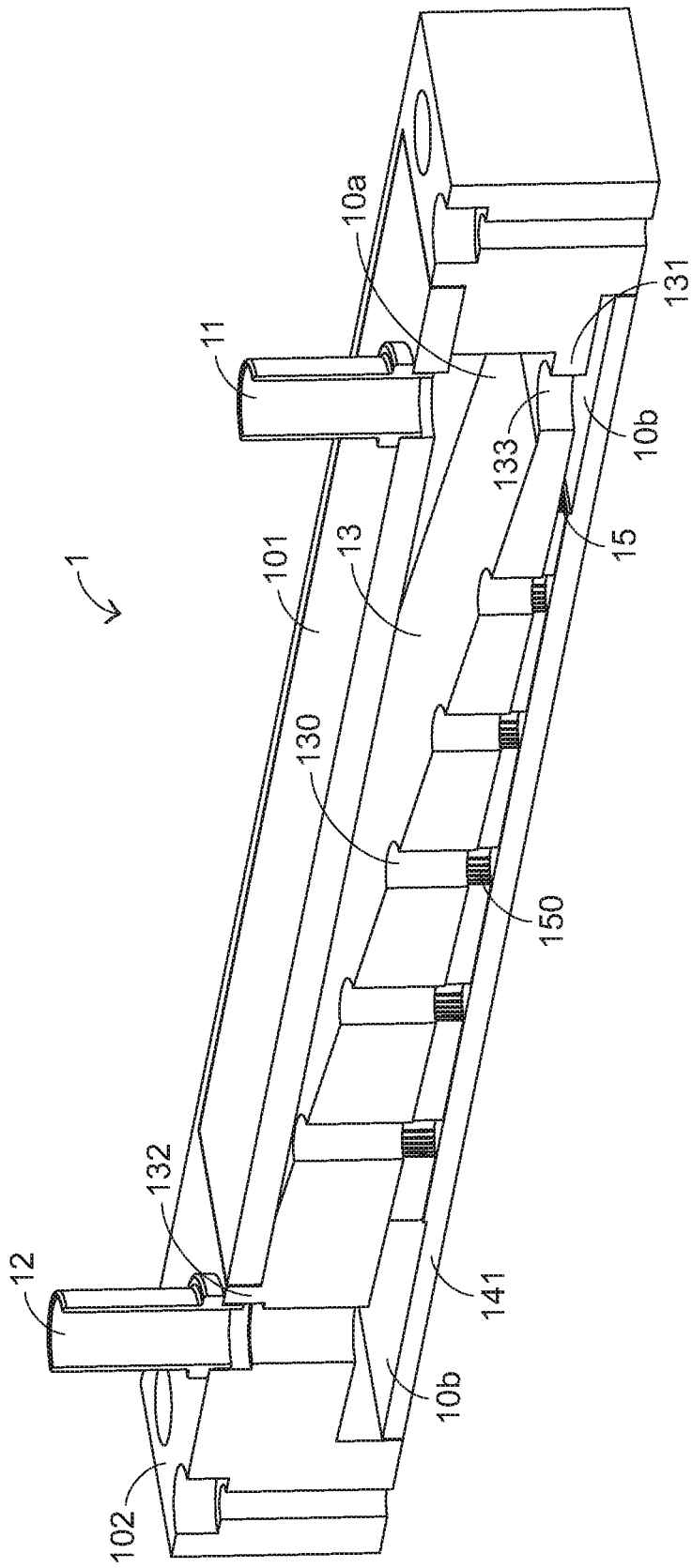
FIG. 3A is a schematic cutaway view illustrating the water-cooling head according to the first embodiment of the present invention.
Figure 3B:
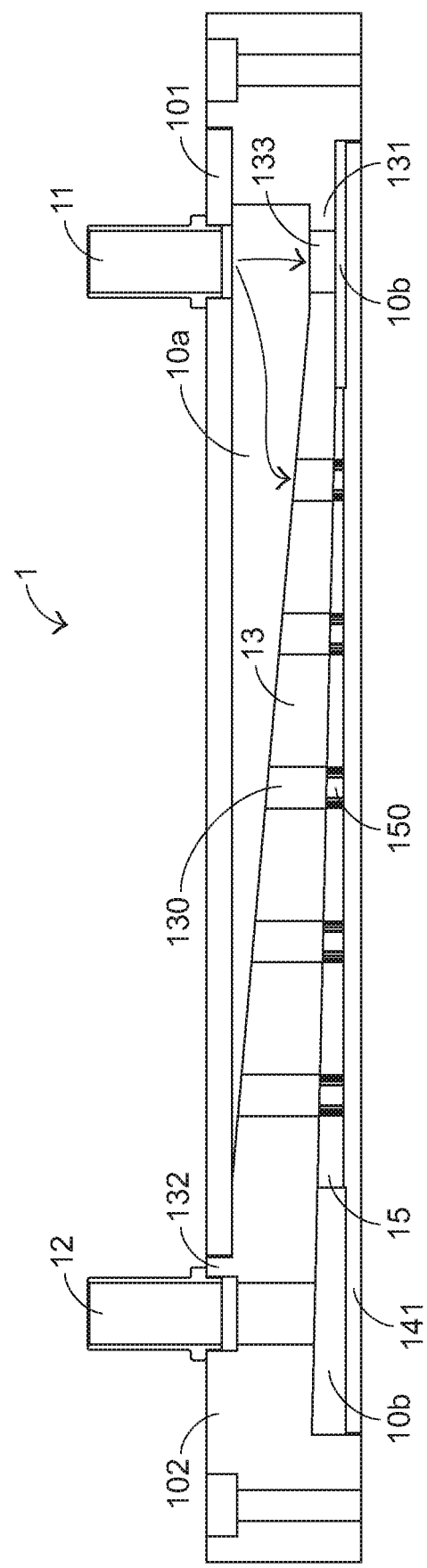
FIG. 3B is a schematic front view illustrating the water-cooling head as shown in FIG. 3A.

A water-cooling head according to a first embodiment of the present invention will be described as follows. Please refer to FIGS. 1, 2A, 2B, 3A and 3B. FIG. 1 is a schematic perspective view illustrating a water-cooling head according to a first embodiment of the present invention. FIG. 2A is a schematic exploded view illustrating the water-cooling head according to the first embodiment of the present invention. FIG. 2B is a schematic exploded view illustrating the water-cooling head as shown in FIG. 2A and taken along another viewpoint. FIG. 3A is a schematic cutaway view illustrating the water-cooling head according to the first embodiment of the present invention. FIG. 3B is a schematic front view illustrating the water-cooling head as shown in FIG. 3A. In this embodiment, the water-cooling head is applied to plural electronic components (not shown). For example, these electronic components include a central processing unit, a display processing chip, a functional chip or any other appropriate electronic component.

As shown in FIGS. 1, 2A, 2B, 3A and 3B, the water-cooling head 1 comprises a casing 10, an inclined flow-guiding structure 13 and a bottom plate assembly 14. The inclined flow-guiding structure 13 is disposed within the casing 10. The bottom plate assembly 14 is assembled with the casing 10 and located under the flow-guiding slant 13. That is, the inclined flow-guiding structure 13 is clamped between the casing 10 and the bottom plate assembly 14. In the embodiment as shown in FIGS. 2A and 2B, the inclined flow-guiding structure 13 is integrally formed with the casing 10. It is noted that numerous modifications and alterations may be made while retaining the teachings of the invention. In another embodiment, the inclined flow-guiding structure 13 and the casing 10 are different components, and the inclined flow-guiding structure 13 and the casing 10 are combined together.

The casing 10 comprises an inlet 11 and an outlet 12. The inlet 11 is in fluid communication with a pump (not shown). The pump us used for moving a cooling liquid along a circulating loop. Consequently, the cooling liquid is fed into the inlet 11. The outlet 12 is in fluid communication with a water-cooling radiator or other heat dissipation mechanism (not shown). After the cooling liquid is introduced into the water-cooling head 1, the cooling liquid can be exited from the outlet 12. The pipes for connecting the pump or the water-cooling radiator and the way of transferring the cooling liquid through the circulating loop are well known to those skilled in the art of the water cooling system, and are not redundantly described herein.

The bottom plate assembly 14 comprises a fin group 15 and a base plate 141. The fin group 15 and the base plate 141 are made of copper, aluminum or any other appropriate metallic material. The fin group 15 is formed on the base plate 141. In this embodiment, the fin group 15 is integrally formed with the base plate 141. It is noted that numerous modifications and alterations may be made while retaining the teachings of the invention. For example, in another embodiment, the fin group 15 and the base plate 141 are different components, and the fin group 15 and the base plate 141 are combined together. The fin group 15 and the base plate 141 are used for transferring heat through thermal conduction. That is, plural electronic components are placed on and contacted with the bottom plate assembly 14.

In this embodiment, the casing 10 comprises an upper cover 101 and a lower cover 102. The inlet 11 is formed on the upper cover 101. The outlet 12 is formed on the lower cover 102. The upper cover 101 and the lower cover 102 are assembled with each other. As shown in FIGS. 1, 2A, 2B, 3A and 3B, the inlet 11 and the outlet 12 are conduits that are protruded externally from the upper cover 101 and the lower cover 102, respectively.

In this embodiment, the inlet 11 and the outlet 12 are located at the same horizontal plane. That is, after the upper cover 101 and the lower cover 102 are assembled with each other, the inlet 11 and the outlet 12 are located at the same level. Moreover, the orientation of the inlet 11 and the orientation of the outlet 12 are in parallel with each other. The upper cover 101 and the lower cover 102 are assembled with each other in a screwing means, a welding means or any other fixing means. Similarly, the casing 10 and the bottom plate assembly 14 (especially the base plate 141) are assembled with each other in a screwing means, a welding means or any other fixing means.

In accordance with a feature of the present invention, the inclined flow-guiding structure 13 in the casing 10 is in an inclined state. As shown in FIGS. 2A, 2B, 3A and 3B, a bottom end 131 of the inclined flow-guiding structure 13 is located under the inlet 11. A top end 132 of the inclined flow-guiding structure 13 is arranged beside the outlet 12. The top end 132 is located at the level higher than the bottom end 131. In other words, the inclined flow-guiding structure 13 is inclined upwardly from an underlying position of the inlet 11 to a nearby position of the outlet 12. Consequently, the inner space of the water-cooling head 1 is divided into two chambers by the inclined flow-guiding structure 13. The two chambers include an upper chamber 10a and a lower chamber 10b. The upper chamber 10a is arranged between the casing 10 and the inclined flow-guiding structure 13. The lower chamber 10b is arranged between the base plate 141 and the inclined flow-guiding structure 13.

In accordance with another feature of the present invention, the inclined flow-guiding structure 13 comprises plural first openings 130. The cooling liquid can be transferred through the plural first openings 130. In the embodiment as shown in FIGS. 2A, 2B, 3A and 3B, the number of the first openings 130 is five. Moreover, the first openings 130 have the circular shapes. The first openings 130 are uniformly distributed and formed in a surface region 13a of the inclined flow-guiding structure 13. Consequently, the inclined flow-guiding structure 13 is not only a partition structure in the water-cooling head 1 but also a flow-guiding intermediate plate. After the cooling liquid is introduced into the upper chamber 10a through the inlet 11, the cooling liquid can be transferred through any of the first openings 130 according to the condition of the cooling liquid (e.g., the pressure or flow velocity of the cooling liquid).

Moreover, the bottom end 131 of the inclined flow-guiding structure 13 is not completely sealed by the bottom plate assembly 14 (especially the base plate 141) or the lower cover 102. Instead, the bottom end 131 of the inclined flow-guiding structure 13 has a second opening 133. The cooling liquid is permitted to be transferred through the second opening 133.

FIG. 3B also illustrates the flowing condition of the cooling liquid along the directions indicated by two arrows. After the cooling liquid is introduced into the upper chamber 10a through the inlet 11, the cooling liquid is firstly transferred to the nearby position of the second opening 133. Then, the cooling liquid is transferred to the fin group 15 within the lower chamber 10b. As the amount of cooling liquid introduced into the lower chamber 10b is gradually increased, the liquid level is gradually increased. Consequently, the cooling liquid at the higher liquid level is guided to the inclined flow-guiding structure 13. Then, the cooling liquid is transferred to the plural first openings 130 and transferred to the underlying fin group 15 through the plural first openings 130.

In some situations, the cooling liquid is transferred through the second opening 133 after being transferred through the first openings 130. For example, if the flow velocity of the cooling liquid is higher or the pressure of the cooling liquid is larger, the cooling liquid is possibly guided to the inclined flow-guiding structure 13 at first.

Nevertheless, since the cooling liquid is guided by the inclined flow-guiding structure 13, the cooling liquid is transferred to the fin group 15 through the second opening 133 or the first openings 130. The cooling liquid is exited from the upper chamber 10a and introduced into the lower chamber 10b through the second opening 133 or the first openings 130. After the cooling liquid is transferred through the fin group 15, the cooling liquid is exited from the lower chamber 10b through the outlet 12.

In this embodiment, the fin group 15 is accommodated within the lower chamber 10b. Moreover, the profile of the fin group 15 is determined according to the profile of the inclined flow-guiding structure 13. For example, the fin group 15 comprises plural fins 151. Moreover, plural concave structures 150 corresponding to the plural first openings 130 are formed in the plural fins 151. For facilitating the cooling liquid to flow, the arrangement of the plural fins 151 coincides with the path of the cooling liquid from the inlet 11 to the outlet 12.

Since every two adjacent fins 151 are separated from each other by a gap and the plural concave structures 150 corresponding to the plural first openings 130 are formed in the plural fins 151, a buffering space is generated. Due to the buffering space, the cooling liquid from the first openings 130 is not hindered by the fins 151. Moreover, the cooling liquid from the plural first openings 130 or the second opening 133 has the lower temperature. Because of the gravity force, the pressure of the cooling liquid or other factors, the cooling liquid is not easily returned back to the upper chamber 10a through the underlying positions of the first openings 130. Consequently, the cooling liquid with the lower temperature can be certainly transferred in the downward direction.

In accordance with the present invention, the inclined flow-guiding structure 13 is capable of guiding the cooling liquid. Consequently, the cooling liquid from the inlet 11 and with the lower temperature is not localized in the front segment (i.e., the position near the inlet 11). That is, a portion of the cooling liquid is guided to the middle segment or even the rear segment (i.e., the position near the outlet 12). Then, the cooling liquid is transferred through the corresponding first openings 130. In such way, the cooling liquid with the lower temperature can be uniformly guided to all positions of the plural fins 151 or all segments of the base plate 141. Consequently, the heat is exchanged homogeneously. Since the temperature of the cooling liquid in the water-cooling head 1 is not locally high or locally low, the efficacy of homogenizing the temperature is enhanced.

It is noted that numerous modifications and alterations may be made while retaining the teachings of the invention. For example, in a variant example, the size of the water-cooling head is specially designed to comply with a single electronic component. That is, the area of the bottom surface of the water-cooling head is determined according to the size of the single electronic component. In another variant example, the first openings are non-uniformly distributed in the surface region of the inclined flow-guiding structure according to the transferring condition of the pump. In a further variant example, the first openings have other shapes. For example, the first openings have a rectangular shape, an elliptic shape or a rounded rectangular shape.

In some situations, while the cooling liquid is transferred through the inclined flow-guiding structure, the cooling liquid is not transferred through the first openings at some levels. For solving this problem, the distribution of the first openings has to be modified. For example, the plural first openings are divided into several groups. The distances between the first openings in the same group and the bottom end of the inclined flow-guiding structure are equal. In the first embodiment, the plural first openings 130 are located at different levels. That is, the distances between different first openings and the bottom end 131 are different. Whereas, in the variant example, some of the plural first openings are located at the same level. Consequently, the distances between these first openings and the bottom end are equal. Under this circumstance, the possibility of transferring the cooling liquid through the first openings is increased.

Figure 4:
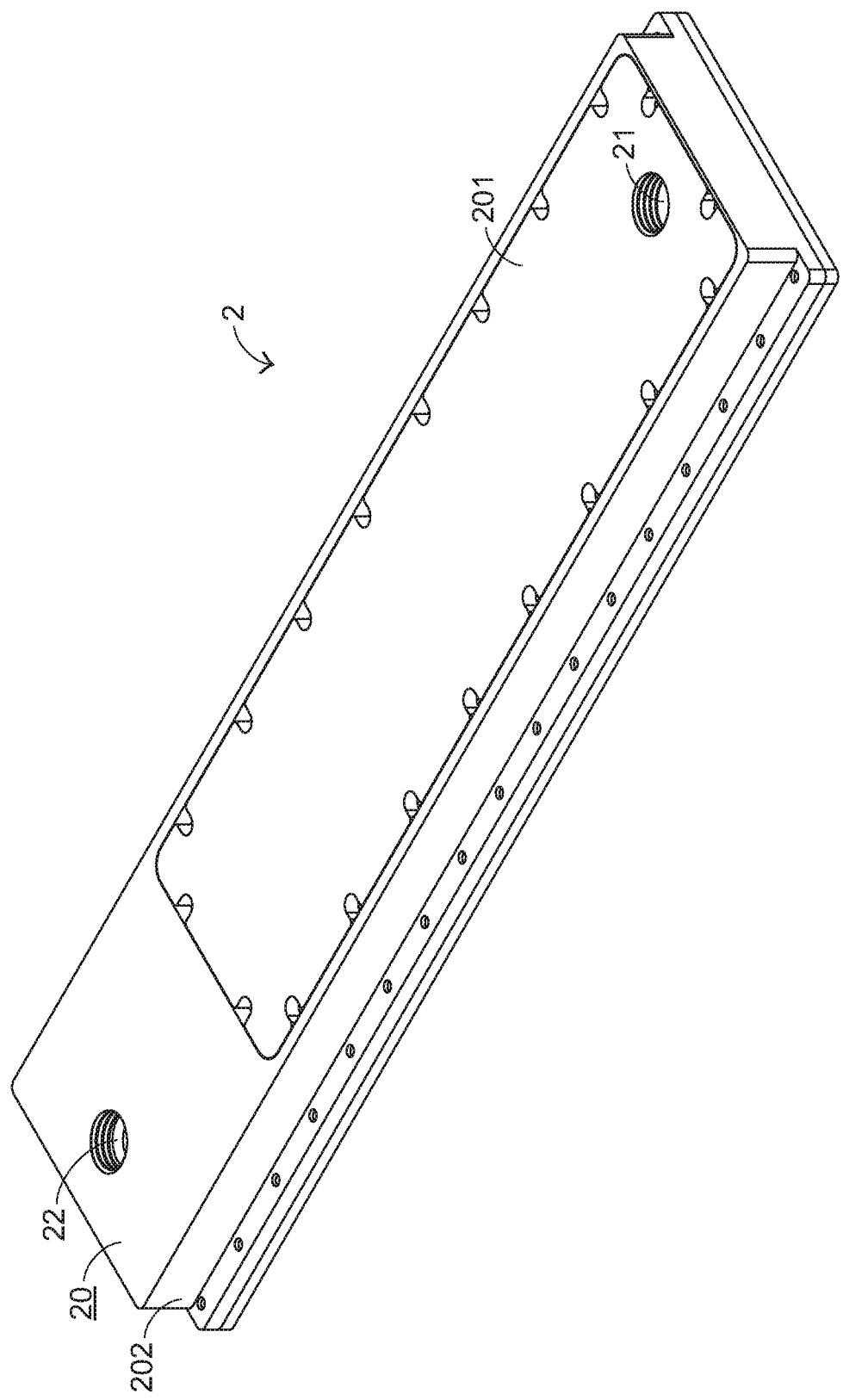
FIG. 4 is a schematic perspective view illustrating a water-cooling head according to a second embodiment of the present invention.
Figure 5A:
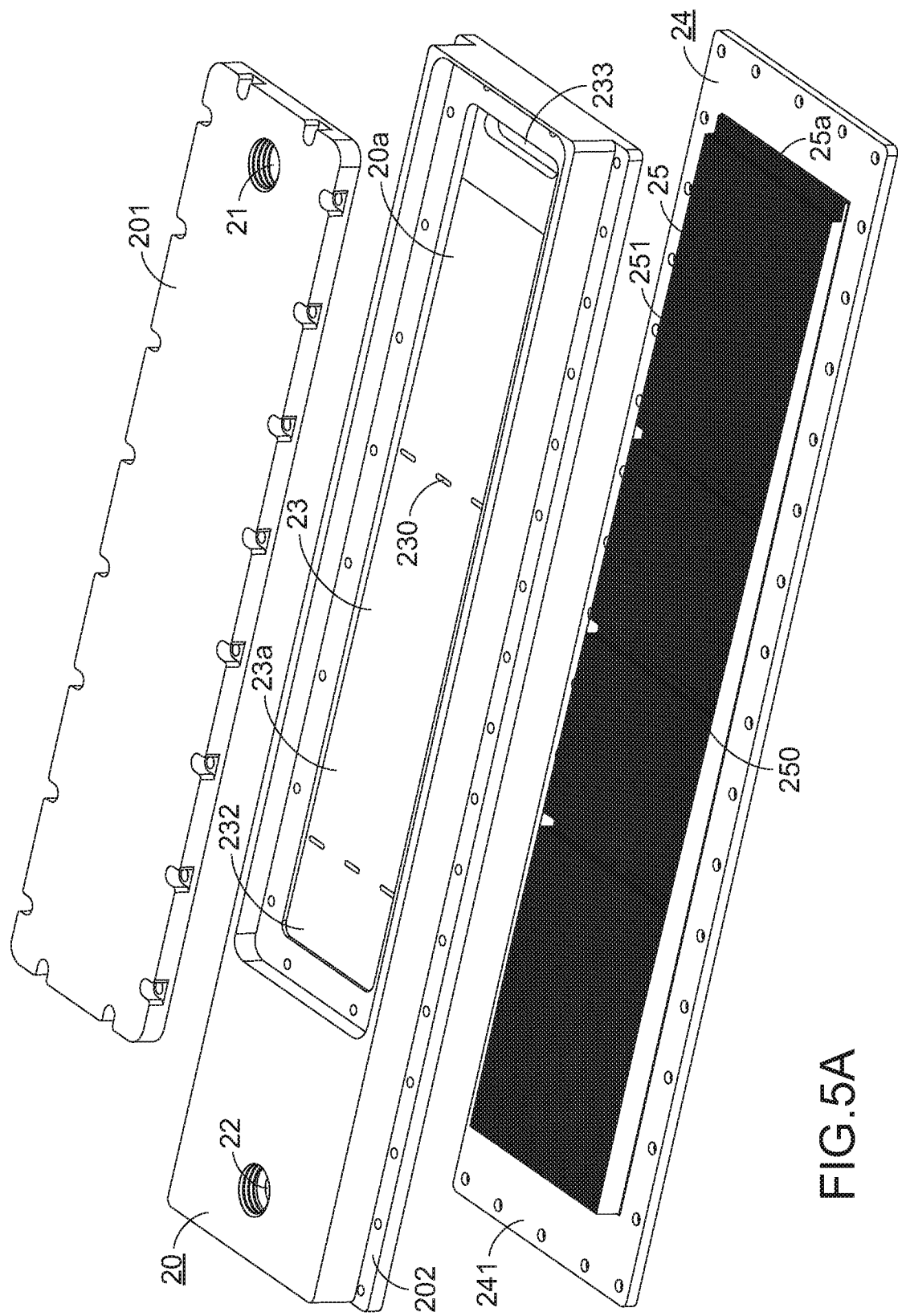
FIG. 5A is a schematic exploded view illustrating the water-cooling head according to the second embodiment of the present invention.
Figure 5B:
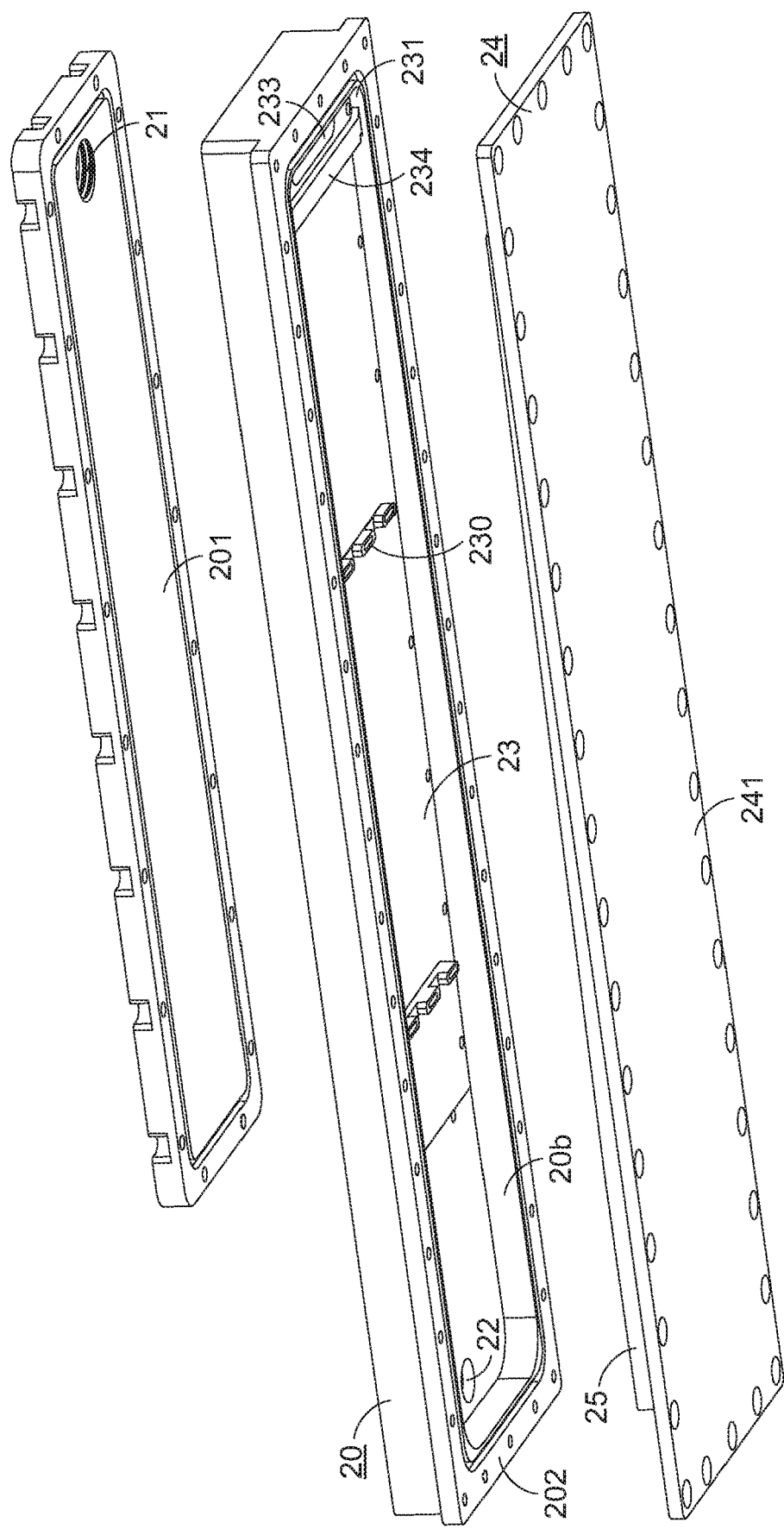
FIG. 5B is a schematic exploded view illustrating the water-cooling head as shown in FIG. 5A and taken along another viewpoint.
Figure 6A:
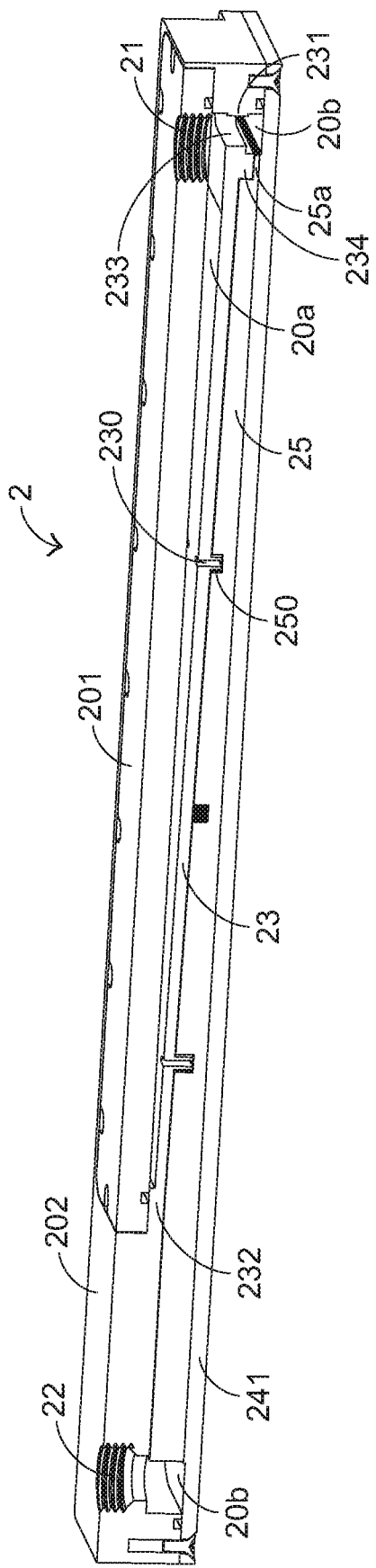
FIG. 6A is a schematic cutaway view illustrating the water-cooling head according to the second embodiment of the present invention.
Figure 6B:
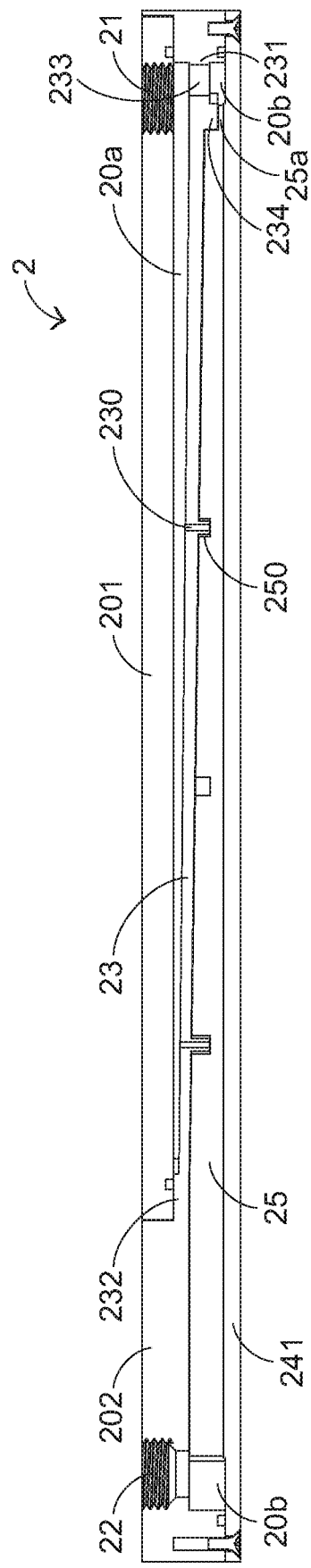
FIG. 6B is a schematic front view illustrating the water-cooling head as shown in FIG. 6A.
Figure 6C:
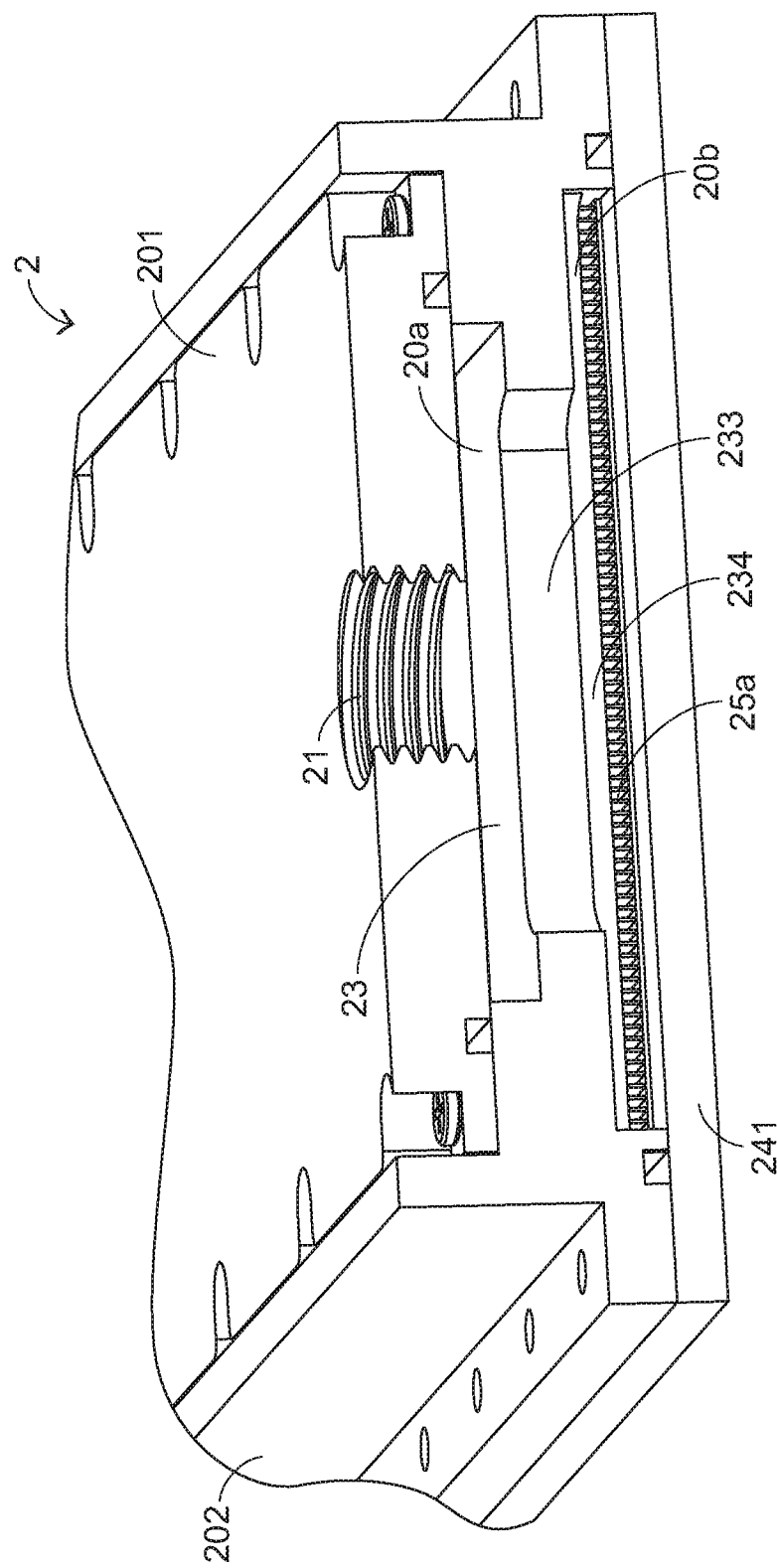
FIG. 6C is a schematic enlarged cutaway view illustrating a portion of the water-cooling head as shown in FIG. 6A and taken along a side viewpoint.

A water-cooling head according to a second embodiment of the present invention will be described as follows. Please refer to FIGS. 4, 5A, 5B, 6A, 6B and 6C. FIG. 4 is a schematic perspective view illustrating a water-cooling head according to a second embodiment of the present invention. FIG. 5A is a schematic exploded view illustrating the water-cooling head according to the second embodiment of the present invention. FIG. 5B is a schematic exploded view illustrating the water-cooling head as shown in FIG. 5A and taken along another viewpoint. FIG. 6A is a schematic cutaway view illustrating the water-cooling head according to the second embodiment of the present invention. FIG. 6B is a schematic front view illustrating the water-cooling head as shown in FIG. 6A. FIG. 6C is a schematic enlarged cutaway view illustrating a portion of the water-cooling head as shown in FIG. 6A and taken along a side viewpoint. Component parts and elements corresponding to those of the first embodiment are designated by similar numeral references. In this embodiment, the water-cooling head 2 comprises a casing 20, an inclined flow-guiding structure 23, a bottom plate assembly 24, an inlet 21 and an outlet 22. The bottom plate assembly 24 comprises a fin group 25 and a base plate 241. The casing 20 comprises an upper cover 201 and a lower cover 202. The inclined flow-guiding structure 23 comprises a top end 232 and a bottom end 231. The top end 232 is located at the level higher than the bottom end 231. Moreover, plural first openings 230 are formed in a surface region 23a of the inclined flow-guiding structure 23. The bottom end 231 of the inclined flow-guiding structure 23 has a second opening 233. The inner space of the water-cooling head 2 is divided into an upper chamber 20a and a lower chamber 20b by the inclined flow-guiding structure 23. The upper chamber 20a is located over the inclined flow-guiding structure 23. The lower chamber 20b is located under the inclined flow-guiding structure 23. The fin group 25 comprises plural fins 251.

In comparison with the first embodiment, a side 25a of the fin group 25 has a stepped structure, and the inclined flow-guiding structure 23 comprises a protrusion part 234. As shown in FIGS. 5A, 5B, 6A, 6B and 6C, the protrusion part 234 is arranged beside the second opening 233 and located over the side 25a of the fin group 25. Moreover, the protrusion part 234 is engaged with the side 25a of the fin group 25.

Since the side 25a of the fin group 25 has the stepped structure, the portions of the fins 251 corresponding to the stepped structure are relatively thinner. Due to the overlying protrusion part 234, the space for transferring the cooling liquid to the fin group 25 is decreased. Consequently, after the cooling liquid is transferred to the lower chamber 20b through the second opening 233, the pressure in this position is increased and the flow velocity of the cooling liquid is increased. Since the cooling liquid can be transferred through the fin group 25 quickly, the heat dissipation efficacy is enhanced.

Please refer to FIGS. 5A and 5B. The plural first openings 230 are divided into several groups. The distances between the first openings 230 in the same group (i.e., at the same level) and the bottom end 231 of the inclined flow-guiding structure 23 are equal. In this embodiment, each group comprises three first openings 230. The plural first openings 230 are protruded downwardly. Under this circumstance, the possibility of transferring the cooling liquid through the first openings 230 is increased. Moreover, plural concave structures 250 corresponding to the plural first openings 230 are formed in the plural fins 251. In this embodiment, the concave structures 250 are inverted-trapezoid trench structures that run through the fins 251 along a horizontal direction. The three downwardly-protruded first openings 230 in each row are received within the corresponding concave structures 250.

In this embodiment, the water-cooling head 2 is used for removing the heat from plural electronic components (i.e., heat sources). Consequently, the length of the casing 20 is much longer than the width of the casing 20. For example, the length of the casing 20 is about 300 millimeter (mm), and the width of the casing 20 is about 65 millimeter (mm) Preferably but not exclusively, the length of the casing 20 (especially the lower cover 202) is several times the width of the casing 20.

From the above descriptions, the water-cooling head of the prevent invention is capable of simultaneously contacting with plural electronic components (i.e., heat sources) and effectively overcoming the drawbacks of the conventional technologies. Consequently, the temperature at the rear segment is not excessively high, the heat accumulation problem is solved, and the temperature is homogenized. When the cooling liquid is transferred to the inclined flow-guiding structure, the cooling liquid is split by the inclined flow-guiding structure. The cooling liquid is transferred to the underlying fin group through the openings of the inclined flow-guiding structure. In such way, the cooling liquid with the lower temperature can be uniformly guided to all segments to exchange the heat. Since the temperature of the cooling liquid in the water-cooling head is not locally high or locally low, the efficacy of homogenizing the temperature is enhanced.

In other words, the water-cooling head of the present invention can overcome the drawbacks of the conventional technologies while achieving the objects of the present invention.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A water-cooling head, comprising:
   a casing comprising an inlet and an outlet, wherein a liquid is fed into the inlet;
   an inclined flow-guiding structure disposed within the casing, and comprising plural first openings, wherein a bottom end of the inclined flow-guiding structure is located under the inlet, a top end of the inclined flow-guiding structure is arranged beside the outlet, the top end is located at a level higher than the bottom end, and a second opening is formed in the bottom end; and
   a bottom plate assembly assembled with the casing, and located under the inclined flow-guiding structure, wherein the bottom plate assembly comprises a fin group,
   wherein after the liquid is transferred to the fin group through the second opening or the plural first openings, the liquid is exited from the outlet.

2. The water-cooling head according to claim 1, wherein the liquid is moved along a circulating loop by a pump, and the pump is in fluid communication with the inlet.

3. The water-cooling head according to claim 1, wherein the water-cooling head is applied to one or plural electronic components, and the water-cooling head is in contact with the one or plural electronic components through the bottom plate assembly.

4. The water-cooling head according to claim 1, wherein the casing comprises an upper cover and a lower cover, wherein the upper cover is assembled with the lower cover, the inlet is disposed on the upper cover, and the outlet is disposed on the lower cover.

5. The water-cooling head according to claim 1, wherein the inlet and the outlet are located at the same level, and an orientation of the inlet and an orientation of the outlet are in parallel with each other.

6. The water-cooling head according to claim 1, wherein the bottom plate assembly further comprises a base plate, and the fin group is formed on the base plate, wherein the fin group is integrally formed with the base plate, or the fin group and the base plate are different components and combined together.

7. The water-cooling head according to claim 6, wherein the water-cooling head further comprises:
   an upper chamber arranged between the casing and the inclined flow-guiding structure, wherein after the liquid is introduced into the upper chamber through the inlet, the liquid is exited from the upper chamber through the second opening or the plural first openings; and
   a lower chamber arranged between the base plate and the inclined flow-guiding structure, wherein after the liquid is transferred to the lower chamber through the second opening or the plural first openings, the liquid is exited from the lower chamber through the outlet,
   wherein the fin group is accommodated within the lower chamber.

8. The water-cooling head according to claim 1, wherein a side of the fin group has a stepped structure, and the inclined flow-guiding structure comprises a protrusion part corresponding to the side of the fin group, wherein the protrusion part is arranged beside the second opening and located over the side of the fin group.

9. The water-cooling head according to claim 1, wherein the fin group comprises plural fins, and plural concave structures corresponding to the plural first openings are formed in the plural fins.

10. The water-cooling head according to claim 1, wherein the plural first openings are uniformly or non-uniformly distributed in a surface region of the inclined flow-guiding structure.

11. The water-cooling head according to claim 1, wherein the plural first openings are divided into several groups, and the distances between the first openings in the same group and the bottom end of the inclined flow-guiding structure are equal.

12. The water-cooling head according to claim 1, wherein the plural first openings have a circular shape, a rectangular shape, an elliptic shape or a rounded rectangular shape.

* * * * *